(12) United States Patent
Kannengiesser et al.

(10) Patent No.: US 8,854,040 B2
(45) Date of Patent: Oct. 7, 2014

(54) METHOD FOR MAGNETIC RESONANCE IMAGING BASED ON PARTIALLY PARALLEL ACQUISITION (PPA)

(75) Inventors: Stephan Kannengiesser, Wuppertal (DE); Jan Ruff, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 517 days.

(21) Appl. No.: 13/187,692

(22) Filed: Jul. 21, 2011

(65) Prior Publication Data

US 2012/0019246 A1    Jan. 26, 2012

(30) Foreign Application Priority Data

Jul. 23, 2010    (DE) .................. 10 2010 032 080

(51) Int. Cl.
*G01V 3/00*    (2006.01)
*G01R 33/561*    (2006.01)
*G01R 33/567*    (2006.01)

(52) U.S. Cl.
CPC ........ *G01R 33/5611* (2013.01); *G01R 33/5673* (2013.01); *G01R 33/5676* (2013.01)
USPC .......................................... 324/309; 600/413

(58) Field of Classification Search
USPC ................... 324/309, 307, 314; 600/413, 410
See application file for complete search history.

(56) References Cited

U.S. PATENT DOCUMENTS

| | | | |
|---|---|---|---|
| 6,144,201 A | 11/2000 | Miyazaki | |
| 6,268,730 B1 | 7/2001 | Du | |
| 7,609,058 B2 * | 10/2009 | Laub et al. | 324/307 |
| 7,649,354 B2 * | 1/2010 | Bayram et al. | 324/309 |
| 8,073,522 B2 * | 12/2011 | Stemmer | 600/410 |
| 2005/0134272 A1 | 6/2005 | Roberts et al. | |
| 2008/0303521 A1 | 12/2008 | Beatty et al. | |

OTHER PUBLICATIONS

"Moderne Leberbildgebung mit der MRT," Zech et al., Der Radiologe, vol. 12 (2004) pp. 1160-1169.
"Simultaneous Acquisition of Spatial Harmonics (SMASH): Fast Imaging with Radiofrequency Coil Arrays", Sodickson et al., Magnetic Resonance in Medicine, vol. 38 (1997) pp. 591-603.
"Generalized Autocalibrating Partially Parallel Acquisitions (GRAPPA)", Griswold et al., Magnetic Resonance in Medicine, vol. 47 (2002) pp. 1202-1210.
"SENSE: Sensitivity Encoding for Fast MRI", Pruessmann et al., Magnetic Resonance in Medicine, vol. 42 (1999) pp. 952-962.
"Dynamic Autocalibrated Parallel Imaging Using Temporal GRAPPA (TGRAPPA)", Breuer et al., Magnetic Resonance in Medicine, vol. 53 (2005) pp. 981-985.

\* cited by examiner

*Primary Examiner* — Louis Arana
(74) *Attorney, Agent, or Firm* — Schiff Hardin LLP

(57) ABSTRACT

In a method and system for magnetic resonance imaging of an examination subject on the basis of partially parallel acquisition (PPA) with multiple component coils, a calibration measurement is implemented in a first time period and an actual measurement for the imaging is implemented in a subsequent second time period. In the calibration measurement, calibration data for predetermined calibration points in spatial frequency space are acquired with the multiple component coils. In the actual measurement, incomplete data sets are respectively acquired in spatial frequency space with each of the multiple component coils. Complete data sets are reconstructed from the incomplete data sets and the calibration data. The first time period and the second time period are different, and the measurements are implemented when triggered in the two time periods. An essentially identical state of the examination subject or of the measurement system is used as a trigger.

10 Claims, 3 Drawing Sheets

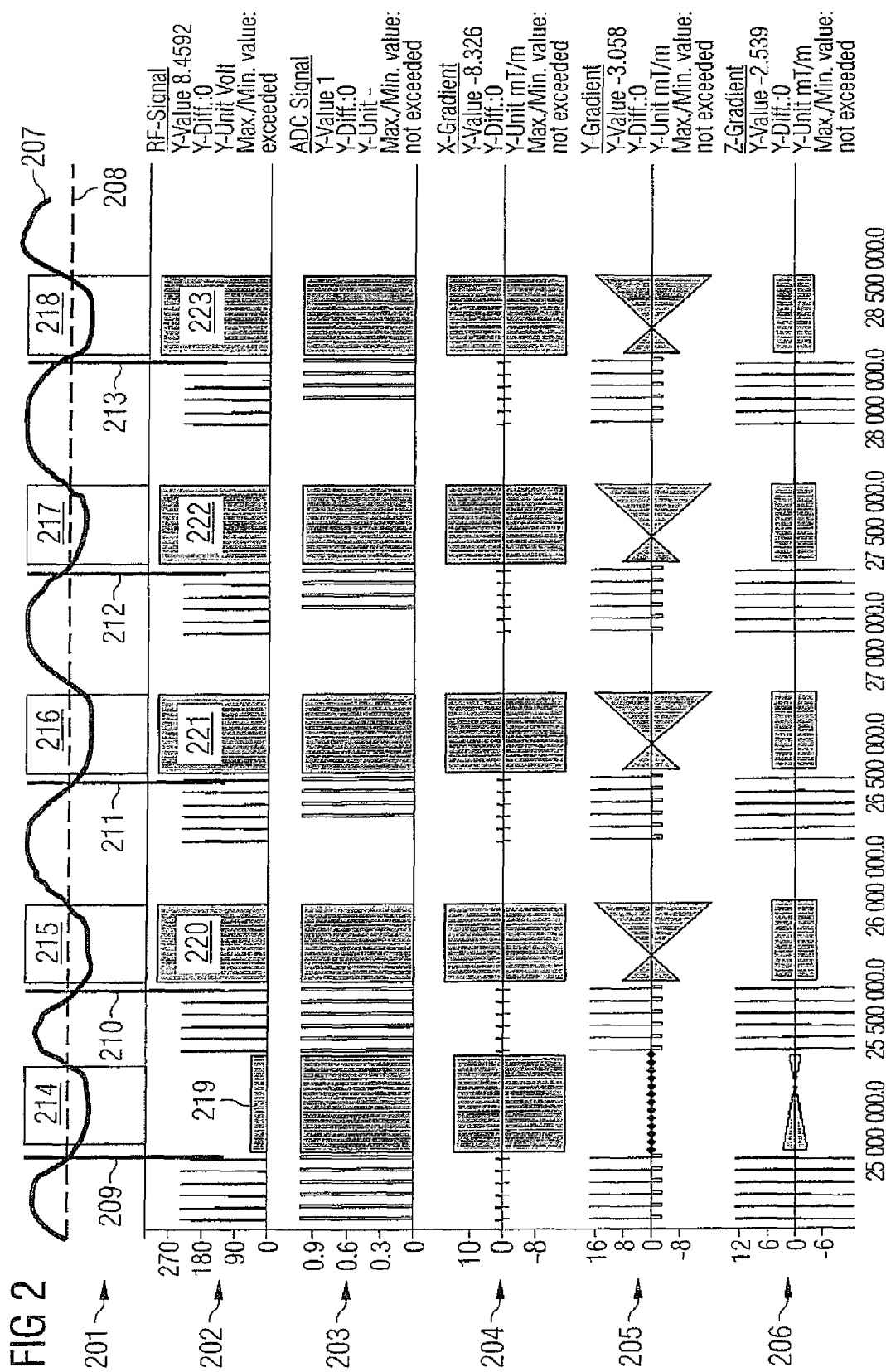

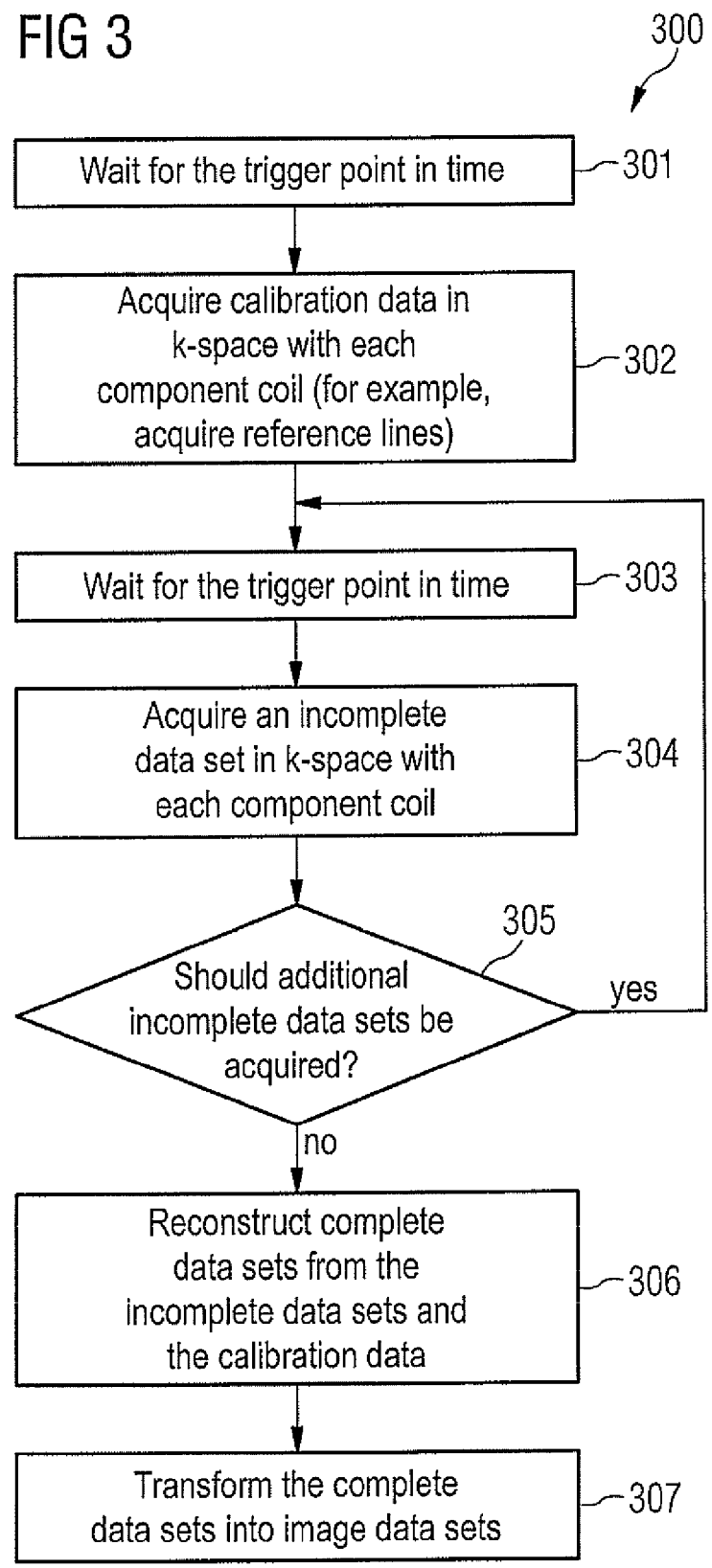

METHOD FOR MAGNETIC RESONANCE IMAGING BASED ON PARTIALLY PARALLEL ACQUISITION (PPA)

BACKGROUND OF THE INVENTION

1. Field of the Invention

The present invention concerns a method for magnetic resonance imaging of an examination subject on the basis of a partially parallel acquisition (PPA) with multiple component coils, as well as a corresponding magnetic resonance system.

2. Description of the Prior Art

By the use of parallel imaging techniques with multiple component coils operating in parallel (Parallel Acquisition Techniques, PAT) in magnetic resonance imaging the detection time—known as the acquisition time (TA)—can be markedly reduced, or given the same acquisition time a markedly higher resolution can be achieved. This occurs by a reduced number of k-space lines being acquired (for example in the phase coding direction in spatial frequency space) than is typically necessary in order to satisfy the Nyquist theorem. Such techniques are known under the designation "partially parallel acquisition (PPA)". In order to reconstruct images with the same resolution from the undersampled k-space data, undersampled (and thus incomplete) data sets are acquired with the use of an arrangement of multiple coils (known as local or component coils), and reference lines. The reference lines are respectively acquired by each of the multiple component coils and serve as calibration data points in order to adapt the incomplete data sets of different component coils to one another in order to generate complete image data. For example, the reference lines can be acquired with lower frequency in a middle region of k-space. In the prior art, appropriate reconstruction methods are known that normally represent algebraic methods, for example SENSE (Sensitive Encoding) and GRAPPA (Generalized Autocalibration PPA).

For static examination subjects or static tissue segments, the partially parallel acquisition and reconstruction techniques are very well developed, and qualitatively high-grade, artifact-free images can be created with conventional partially parallel acquisition.

Partially parallel acquisition is particularly suitable for the acquisition of moving tissue because the shortened acquisition time can reduce movement artifacts. While the acquisition time for 2-dimensional images is often fast enough to freeze the movement, for volume or 3D acquisitions the acquisition time is generally not short enough in order to acquire the entirety of the data within a sufficiently small fraction of a typical periodic movement (for example a breathing cycle) so as to acquire images without movement artifacts. In order to shorten the acquisition time for a single high-resolution 2-dimensional or 3-dimensional image, the reference lines can be acquired separately beforehand in a partially parallel acquisition. This acquisition technique can reduce the acquisition time of an image in k-space, but it must be insured that the information in the reference lines must be coherent with regard to the subsequently acquired image information in order to be able to implement a reconstruction of the partially parallel acquisition. If portions of the examination subject are at different locations during the acquisition of the reference lines and the acquisition of the image itself, ghost artifacts can arise. Artifacts can likewise arise if the state of the measurement system changes between the acquisition of the reference lines and the acquisition of the image data (i.e. B0 field, shim, eddy currents, B1 field).

SUMMARY OF THE INVENTION

An object of the present invention is to provide an improved method for magnetic resonance imaging on the basis of partially parallel acquisition with multiple component coils, whereby movement artifacts are avoided and in spite of this a high image resolution and image quality can be achieved.

Within the scope of the present invention, a method is provided for magnetic resonance imaging of an examination subject on the basis of partially parallel acquisition. In the partially parallel acquisition (PPA), data in spatial frequency space (known as k-space data) are acquired by multiple coils (known as component coils). Each of the spatially independent component coils carries certain spatial information that is used in order to achieve a complete spatial coding by a combination of the simultaneously acquired coil data. In the inventive method, a calibration measurement is implemented in one time period (designated as a first time period in the following, wherein the order is insignificant). In the calibration measurement, calibration data for predetermined calibration points in spatial frequency space are acquired with the multiple component coils. The calibration points can include reference lines in spatial frequency space, for example. The calibration data for the predetermined calibration points are acquired simultaneously with the multiple component coils. An additional measurement—the actual measurement to determine data in spatial frequency space from which image data can later be generated via mathematical transformation of the data—is implemented in the following time period (designated as a second time period). In the actual measurement, an incomplete data set in spatial frequency space is respectively acquired with each of the multiple component coils. Complete data sets are then reconstructed via combination of the incomplete data sets by using of the calibration data. Complete image data sets can then be formed from these complete data sets e.g. with the aid of a Fourier transformation. The first time period and the second time period are different, meaning that the calibration measurement is not implemented at the same time as the actual measurement. However, the first time period and the second time period are selected so that the calibration measurement in the first time period and the actual measurement in the second time period are triggered by an essentially identical state of the examination subject. Given a periodic movement of the examination subject, the measurements can be implemented, for example, in time periods that begin at a predetermined point in time within the periodic movement. For example, the time periods can be selected so as to be triggered by a heartbeat, such that the time periods respectively begin at an identical state within a heartbeat interval of the examination subject. Furthermore, the two time periods can be breathing-triggered, such that the time periods respectively begin at the same point in time within a breathing interval of the examination subject. Alternatively or additionally, the predetermined state of the examination subject that is essentially identical for both time periods can comprise a predetermined point in time within a period variation of the examination system, for example given periodic variations of boundary conditions which vary the B0 homogeneity or an eddy current behavior. Examples for examination systems where this situation could arise, would, for example, be upcoming integrated systems as MR-hyprid systems like MR-RT-systems (RT: radiation therapy) where parts of the examination system might disturb the B0 homogeneity in accordance with e.g. an activity of these parts. In the case of an MR-RT-system with a rotating gantry integrated within the static field of the MR part of the system, e.g. the rotating gantry, might disturb the B0 homogeneity in accordance with its motion, periodically or otherwise Because the calibration measurement is implemented separately from the actual measurement, the acquisition time of both the calibration measurement and the actual measurement can be reduced, so movement artifacts can be avoided. Because both the calibration measurement and the actual measurement are implemented during an identical time period of a periodic movement, it can be ensured that the calibration data match the data of the actual measurement. Moreover, the actual measurement can be implemented in multiple partial measurements which are respectively implemented in turn in time periods which are triggered by an essentially identical state of the examination subject. The quality and resolution of the image data sets obtained from the reconstructed data can be improved. The calibration measurement can be implemented under simplified conditions, for example with a lower contrast or without preparation modules which are required for the actual measurement. A large quantity of calibration data can be acquired within the first time period, with the quality of the reconstruction of the complete data sets from the incomplete data sets being improved.

The calibration measurement also can be implemented chronologically after the actual measurement, meaning that the terms "first time period" and "second time period" do not predetermine an order in the implementation of the method.

According to the present invention, a magnetic resonance system is furthermore provided for magnetic resonance imaging of an examination subject on the basis of a partially parallel acquisition with multiple component coils. The magnetic resonance system has a basic field magnet; a gradient field system; the multiple component coils; and a control device. The control device serves to activate the gradient field system and the multiple component coils; to receive measurement signals which are acquired by the multiple component coils; to evaluate the measurement signals; and to create magnetic resonance images. The magnetic resonance system is designed such that a calibration measurement is implemented in a first time period, and an additional measurement—the actual measurement to generate magnetic resonance images—is implemented in a second time period. In the calibration measurement, calibration data for predetermined calibration points in spatial frequency space are acquired with the multiple component coils. For example, the calibration data can include reference lines in spatial frequency space. The calibration data can be acquired simultaneously with the multiple component coils. In the actual measurement, an incomplete data set in spatial frequency space is respectively acquired with each of the multiple component coils. The acquisition of the data sets with the multiple component coils can be implemented simultaneously. To generate the magnetic resonance images, complete data sets are initially reconstructed from the incomplete data sets and the calibration data. The magnetic resonance images can be generated by transforming the complete data sets into complete image data sets. The first time period and the second time period are different, meaning that the calibration measurement and the actual measurement are implemented at different times. However, the calibration measurement during the first time period and the actual measurement during the second time period are implemented at essentially the same state of the examination subject, in that the first time period and the second time period are started or triggered at the beginning of this essentially identical state.

The advantages of the magnetic resonance system according to the invention therefore essentially correspond to the advantages of the method according to the invention that are described above.

Furthermore, the present invention encompasses a non-transitory computer-readable storage medium encoded with programming instructions representing a computer program or software, which can be loaded into a memory of a programmable controller or a computer of a magnetic resonance system. All or various embodiments of the method according to the invention that are described above can be implemented by the programming instructions when the computer program product is executed in the controller or control device of the magnetic resonance system. The programming instructions may possibly require program means (for example libraries and auxiliary functions) in order to realize the corresponding embodiments of the method. The software can be in source code (C++ or Java, for example) that must still be compiled (translated) and linked, or that must only be interpreted, or can be an executable software code that is only to be loaded into the corresponding computer for execution.

The computer-readable data medium can be, for example, a DVD, a CD, a magnetic tape or a USB stick—on which electronically readable control information, in particular software (see above) is stored. All embodiments according to the invention of the method described above can be implemented when this control information (software) is read from the data medium and stored in a controller or, respectively, computer of a magnetic resonance system.

BRIEF DESCRIPTION OF THE DRAWINGS

FIG. 2 shows temporal curves given an activation of a magnetic resonance system (RF transmission, data sampling (ADC) and gradient switching) according to an embodiment of the method of the present invention.

FIG. 3 shows a program workflow diagram of a method according to the invention.

DESCRIPTION OF THE PREFERRED EMBODIMENTS

Figure 1:
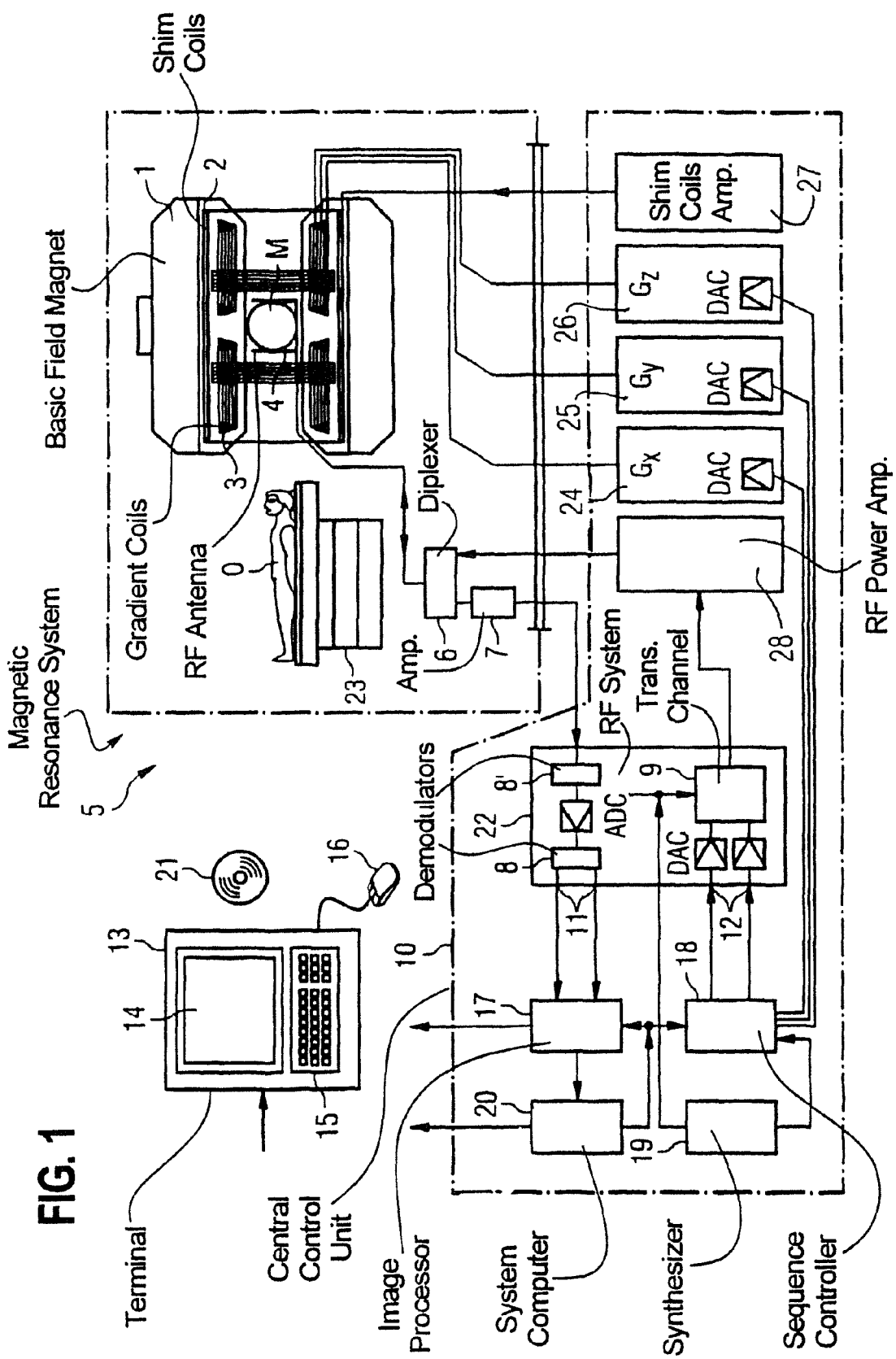
FIG. 1 schematically depicts a magnetic resonance system according to the invention.

FIG. 1 shows a schematic representation of a magnetic resonance system 5 (a magnetic resonance imaging or magnetic resonance tomography apparatus). A basic field magnet 1 thereby generates a temporally constant, strong magnetic field for polarization or alignment of the nuclear spins in an examination region of a subject O, for example a part of a human body that is to be examined which, resting on a table 23, is slid into the magnetic resonance system 5. The high homogeneity of the basic magnetic field that is required for nuclear magnetic resonance measurement is defined in a typical spherical measurement volume M into which the parts of the human body that are to be examined are introduced. To support the homogeneity requirements, and in particular to eliminate temporally invariable influences, what are known as shim plates made of ferromagnetic material can be attached at suitable points. Temporally variable influences can be eliminated by shim coils 2 and a suitable amplifier 27 for the shim coils 2.

A cylindrical gradient coil system 3 which consists of three partial windings is inserted into the basic field magnet 1. Each partial winding is supplied by a corresponding amplifier 24-26 with current to generate a linear gradient field in the respective direction of the Cartesian coordinate system. The first partial winding of the gradient field system 3 thereby generates a gradient $G_x$ in the x-direction; the second partial winding generates a gradient $G_y$ in the y-direction; and the third partial winding generates a gradient $G_z$ in the z-direction. The amplifier 24-26 has a digital/analog converter (DAC) which is activated by a sequence controller 18 for time-accurate generation of gradient pulses.

Located within the gradient field system 3 is a radio-frequency antenna 4 which converts the radio-frequency pulses emitted by a radio-frequency power amplifier into an alternating magnetic field for the excitation of the nuclei and alignment of the nuclear spins of the subject to be examined or of the region of the subject that is to be examined. The radio-frequency antenna 4 consists of one or more RF transmission coils and multiple RF reception coils in the form of an annular, linear or matrix-like arrangement of component coils, for example. The alternating field emanating from the precessing nuclear spins—i.e. normally the nuclear spin echo signals caused by a pulse sequence made up of one or more radio-frequency pulses and one or more gradient pulses—is also converted by the RF reception coils of the radio-frequency antenna 4 into a voltage (measurement signal) which is supplied via an amplifier 7 to a radio-frequency reception channel 8, 8' of a radio -frequency system 22. The radio-frequency system 22 furthermore comprises a transmission channel 9 in which the radio-frequency pulses are generated for the excitation of the nuclear magnetic resonance. Based on a pulse sequence provided by the system computer 20, the respective radio-frequency pulses are thereby digitally represented in the sequence controller 18 as a series of complex numbers. This number sequence is supplied as real part and imaginary part to a digital/analog converter (DAC) in the radio-frequency system 22 via an input 12, and from said radio-frequency system 22 to a transmission channel 9. In the transmission channel 9 the pulse sequences are modulated on a radio-frequency carrier signal whose basic frequency corresponds to the resonance frequency of the nuclear spins in the measurement volume. The modulated pulse sequences are supplied via an amplifier 28 to the RE transmission coil of the radio-frequency antenna 4.

The switching over from transmission operation to reception operation takes place via a transmission/reception diplexer 6. The RF transmission coils of the radio-frequency antenna 4 radiates the radio-frequency pulses to excite the spins in the measurement volume M, and resulting echo signals are scanned via the RF reception coils. The correspondingly acquired nuclear magnetic resonance signals can be phase-sensitively demodulated at an intermediate frequency in a first demodulator 8' of the reception channel of the radio-frequency system 22 and digitized in the analog/digital converter (ADC). This signal is further demodulated to a frequency of 0. The demodulation to a frequency of 0 and the division into real part and imaginary part occur after the digitization in the digital domain in a second demodulator 8 which outputs the demodulated data via outputs 11 to an image computer 17. An MR image is reconstructed by the image computer 17 from the measurement data acquired in such a manner. The administration of the measurement data, the image data and the control programs takes place via the system computer 20. Due to a requirement with control programs, the sequence controller 18 monitors the generation of the respective desired pulse sequences and the corresponding scanning of k-space. In particular, the sequence controller 18 controls the time-accurate switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs for the generation of an MR image and the presentation of the generated MR image take place through a terminal 13 which comprises a keyboard 15, a mouse 16 and a screen 14.

In order to implement measurements with a partially parallel acquisition with a magnetic resonance tomographic scanner, an arrangement of multiple coils is typically used. These coils—known as component coils—are connected to what is known as a coil array and arranged so as to be mutually adjacent or overlapping, so adjoining, overlapping coil images can likewise be acquired. In order to not extend the acquisition time while simultaneously improving the signal-to-noise ratio, the coils of a coil array receive simultaneously. Since the phase coding takes a lot of time in comparison to other spatial codings, partially parallel acquisition (PPA) is based on a reduction of the number of time-consuming phase coding steps. In PPA imaging the k-space data are acquired with a linear arrangement of component coils (the coil array), for example, instead of a single coil. Each of the spatially independent coils of the array carries certain spatial information which is used in order to achieve a complete spatial coding via a combination of the simultaneously acquired coil data. This means that multiple lines offset in k-space that were not scanned can be reconstructed from one k-space line. Partially parallel acquisition thus uses spatial information that is contained in the components of a coil arrangement in order to partially replace the phase coding that is normally generated using a phase coding gradient. The image measurement time is thereby reduced corresponding to the ratio of the number of fines of the reduced (incomplete) data set to the number of lines of the conventional (thus complete) data set. The reconstruction method—for example an algebraic method—requires additional calibration data points that are added to the actual measurement data and on the basis of which a reduced data set can only be completed again at all. Corresponding PPA techniques are known in the prior art SENSE (Sensitive Encoding) and GRAPPA (Generalized Autocalibrating Partially Parallel Acquisition), for example, and are therefore not explained in detail here.

An implementation of a magnetic resonance imaging based on a partially parallel acquisition according to the present invention is described in detail in the following with reference to FIGS. 2 and 3. Shown in this regard in FIG. 2 are temporal curves representing RF transmission, data sampling (ADC) and gradient switching in multiple lines 201-206. A workflow diagram 300 which depicts the individual steps to implement the method is shown in FIG. 3.

In the method 300, in Step 301 the method initially waits for a trigger point in time. The trigger point in time can comprise a heartbeat trigger which is derived from a heartbeat of a patient to be examined or a breathing trigger which is derived from the breathing of the patient to be examined, for example. The heartbeat trigger can be provided with the aid of an electrocardiogram monitor (EKG monitor), for example. The breathing trigger can be provided with the aid of what is known as a breathing pillow, for example, or be determined on the basis of rapidly measured MR profiles. A signal curve of a breathing curve 207 (what is known as an inspiration-expiration curve) as it can be detected with the aid of a breathing pillow, for example, is shown in the first line 201 of FIG. 2. The image data of the magnetic resonance exposure should be acquired during the expiration, for example. A specific level 208 is therefore defined, and a trigger signal 209-213 is always released precisely when the breathing curve 207 crosses the predetermined level 208 upon exhaling. In a time period 214-218 after the respective trigger point in time 209-213, magnetic resonance data are then acquired in that magnetic field gradients are generated in the three spatial directions X (line 204), Y (line 205) and Z (line 206); radio-frequency signals (line 203) are radiated into the measurement volume M via the radio-frequency antenna 4 to excite the nuclear spins; and corresponding nuclear magnetic resonance signals 219-223 (line 202) are received with the component coils of the radio-frequency antenna 4. In the first time period 214 which is defined by the first trigger point in time 209, calibration data 219 in k-space are detected with each component coil (Step 302). For example, in the first time period 214 multiple reference lines in k-space are acquired with each component coil. As is apparent from the gradients that are shown in lines 204-206, the reference lines are acquired in specific central regions of k-space. It should be noted that the signal curves shown in lines 202-206 are in particular only schematically depicted during the time periods 214-218. In reality the signal curves that are shown flat correspond to a plurality of signal changes that, however, run so quickly that they cannot be depicted at the shown resolution of FIG. 2. The upper and lower edges of the flat signal curves thus represent envelopes of the actual, real signal curves. Individual MR acquisitions are visible outside of the time periods 214-218, i.e. in particular respectively before the corresponding time periods. These represent examples of MR navigators. The breathing state can be determined via the diaphragm position from the profile of the navigators.

After the reference lines have been acquired with each component coil in a first time period 214 (Step 302), the process waits for the next trigger point in time 210 (Step 303). The second time period 215 during the second exhalation phase of the patient follows the second trigger point in time 210. In this second time period 215 a data set 220 in k-space is acquired with the component coils (Step 304). The data set 220 acquired in the second time period 215 can comprise a complete or incomplete k-space slice, for example. Since in the present example a 3-dimensional image measurement should be implemented, additional data sets 221-223 are acquired in additional time periods 216-218 (comparable to the acquisition in the second time period 215). The time periods 216-218 are respectively defined via corresponding trigger points in time 211-213. Complete or incomplete data sets 221-223 for additional k-space slices of the examination subject can respectively be acquired in turn in the additional time periods 216-218. This is continued until a sufficient quantity of data sets 220-223 has been acquired (Step 305). A complete data set is reconstructed from the acquired data sets 220-223 in Step 306 using the calibration data acquired in the time period 214. In the event that the individual data sets 220-223 which were respectively acquired in the time periods 215-218 were incomplete, in the reconstruction the missing data can be completed by combining the present data with the calibration data. For example, for this it is attempted to linearly combine the present data 220-223 of the incomplete data set so that the additional measured reference data 219 are adapted as well as possible with them. This procedure is also known as "fitting". The reference data 219 thus serves as a target function that can be better adapted the more acquired data 220-223 that exist, which possibly are distributed to incomplete data sets of different component coils. In the event that the acquired data sets 220-223 have already been completely acquired, unacquired data sets for interposed k-space slices can be reconstructed in the same manner from the acquired data sets 220-223 and the calibration data 219.

Moreover, it is also possible to reconstruct both the data sets themselves and data sets for interposed k-space slices in the event of incompletely acquired data sets. In Step 307 the complete 3-dimensional data set is then transformed into a corresponding image data set.

Since the image measurement takes longer than an expiration phase of the examination subject, a portion of k-space is respectively acquired after the trigger 210-213. Since the reference data are acquired in a separate expiration phase 214 and not together with the image measurement in the time periods 215-218, more time is provided for the acquisition of the image data in the time periods 215-218 so that movement artifacts can be reduced or the resolution of the image measurement can be reduced or the resolution of the image measurement can be increased. A coherency of the reference data and the actual image measurement is ensured by the triggering of both the acquisition of the calibration data and the acquisition of the image data.

In the example described above, a 3D image measurement based on a partially parallel acquisition was described. However, the present invention is not limited to 3D image measurements; rather, it can also be comparably used for 2D image measurements. For example, for this in the first time period 215 an incomplete data set can be acquired which is then completed via reconstruction with the aid of the calibration data. The additional measurements in the time periods 216-218 are then unnecessary. Alternatively, however, in a 2D image measurement as well k-space can be incompletely acquired in multiple time periods 215-218, and in a subsequent reconstruction a complete 2D data set can be generated from the incomplete data sets and the calibration data.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic resonance imaging of a living subject exhibiting a non-temporally constant state, comprising the steps of:

in a first part of a partially parallel acquisition procedure, operating a magnetic resonance data acquisition unit in which the subject is located to implement a single calibration measurement in a first time period in which a single calibration data set is acquired from a region of the subject, comprised of data respectively acquired by multiple data acquisition coils for predetermined calibration points in k-space;

in a second part of said partially parallel acquisition procedure, operating said magnetic resonance data acquisition unit with said subject located therein to acquire measurement data from said region of the subject in a second time period that entirely follows a termination of said first time period, said measurement data being acquired respectively by said multiple component coils as respective incomplete data sets in k-space;

triggering said second time period when the subject exhibits a state that is identical to the state of the subject in said first time period; and in a computerized processor, reconstructing a complete magnetic resonance image data set from said incomplete data sets and said single calibration data set, and making said complete magnetic resonance image data set available in electronic form at an output of the processor.

2. A method as claimed in claim 1 comprising triggering acquisition of data in said first time period and in said second time period when the examination subject exhibits a same point in time within a periodic movement of the examination subject.

3. A method as claimed in claim 1 comprising triggering acquisition of data in said first time period and in said second time period when the examination subject exhibits a same point in time within a periodic variation of the examination system.

4. A method as claimed in claim 1 comprising triggering acquisition of data in said first time period and in said second time period when the examination subject exhibits a same point in time within a cardiac cycle of the examination subject.

5. A method as claimed in claim 1 comprising triggering acquisition of data in said first time period and in said second time period when the examination subject exhibits a same point in time within a respiratory cycle of the examination subject.

6. A method as claimed in claim 1 comprising administering radiation therapy to the subject in the magnetic resonance data acquisition unit with a rotating gantry that interacts with a static magnetic field generated by the magnetic resonance data acquisition unit.

7. An apparatus for magnetic resonance imaging of a living subject exhibiting a non-temporally constant state, comprising:
    a magnetic resonance data acquisition unit comprising multiple acquisition coils;
    a control unit configured to operate said magnetic resonance data acquisition unit, with the subject located therein, to implement a partially parallel acquisition procedure by operating said magnetic resonance data acquisition unit, in a first part of the partially parallel acquisition procedure, to implement a single calibration measurement in a first time period in which a single calibration data set is acquired from a region of the subject, comprised of data respectively acquired by said multiple data acquisition coils for predetermined calibration points in k-space;
    said control unit being configured to operate said magnetic resonance data acquisition unit, in a second part of said partially parallel acquisition procedure, to acquire measurement data from said region of the subject in a second time period that entirely follows a termination of said first time period, said measurement data being acquired respectively by said multiple component coils as respective incomplete data sets in k-space;
    said control unit being configured to trigger said second time period when the subject exhibits a state that is identical to the state of the subject in said first time period; and
    a computerized processor configured to reconstruct a complete magnetic resonance image data set from said incomplete data sets and said single calibration data set, and to make said complete magnetic resonance image data set available in electronic form at an output of the processor.

8. An apparatus as claimed in claim 7 wherein said magnetic resonance data acquisition unit is a magnetic resonance tomography-radiation therapy hybrid apparatus.

9. An apparatus as claimed in claim 8 wherein said hybrid apparatus comprises a rotating gantry that emits therapeutic radiation, said rotating gantry interacting with a static magnetic field generated by said magnetic resonance data acquisition unit.

10. A non-transitory computer-readable storage medium encoded with programming instructions, said storage medium being loaded into a computerized control and image reconstruction system of a magnetic resonance apparatus having a magnetic resonance data acquisition unit with multiple acquisition coils, said programming instructions causing said computerized control and image reconstruction system to generate an image of a living subject exhibiting a non-temporally constant state by:
    in a first part of a partially parallel acquisition procedure, operating the magnetic resonance data acquisition unit in which the subject is located to implement a single calibration measurement in a first time period in which a single calibration data set is acquired from a region of the subject, comprised of data respectively acquired by the multiple data acquisition coils for predetermined calibration points in k-space;
    in a second part of said partially parallel acquisition procedure, operating said magnetic resonance data acquisition unit with the subject located therein to acquire measurement data from said region of the subject in a second time period that entirely follows a termination of said first time period, said measurement data being acquired respectively by said multiple component coils as respective incomplete data sets in k-space;
    triggering said second time period when the subject exhibits a state that is identical to the state of the subject in said first time period; and
    reconstructing a complete magnetic resonance image data set from said incomplete data sets and said single calibration data set, and making said complete magnetic resonance image data set available in electronic form at an output of the processor.

* * * * *